United States Patent
Lee et al.

(10) Patent No.: US 12,006,567 B2
(45) Date of Patent: Jun. 11, 2024

(54) PLASMA SPRAY PHYSICAL VAPOR DEPOSITION DEPOSITED IN MULTILAYER, MULTI-MICROSTRUCTURE ENVIRONMENTAL BARRIER COATING

(71) Applicant: Rolls-Royce Corporation, Indianapolis, IN (US)

(72) Inventors: Kang N. Lee, Avon, OH (US); Matthew R. Gold, Carmel, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 695 days.

(21) Appl. No.: 17/167,662

(22) Filed: Feb. 4, 2021

(65) Prior Publication Data

US 2021/0404050 A1    Dec. 30, 2021

Related U.S. Application Data (62) Division of application No. 15/418,393, filed on Jan. 27, 2017, now Pat. No. 10,941,484.

(Continued)

(51) Int. Cl.
  *C23C 14/32*    (2006.01)
  *B32B 18/00*    (2006.01)
  (Continued)

(52) U.S. Cl.
  CPC ............ *C23C 14/32* (2013.01); *C04B 41/009* (2013.01); *C04B 41/4527* (2013.01);
  (Continued)

(58) Field of Classification Search
  CPC ..... C23C 14/548; C23C 14/10; C23C 14/083; C23C 14/32; C23C 4/11; C23C 4/134; C04B 41/89; C04B 41/52; C04B 41/4527
  See application file for complete search history.

(56) References Cited

U.S. PATENT DOCUMENTS 3,617,358 A    11/1971    Dittrich
6,610,370 B2    8/2003    Wang et al.
(Continued)

FOREIGN PATENT DOCUMENTS

EP    2192098 A2    6/2010
EP    2918698 A1    5/2016
(Continued)

OTHER PUBLICATIONS

Harder et al. High Temperature Multilayer Environmental Barrier Coatings Deposited Via Plasma Spray—Physical Vapor Deposition, presentation, MS&T conference Oct. 2014, (Year: 2014).*

(Continued)

*Primary Examiner* — Kelly M Gambetta
(74) *Attorney, Agent, or Firm* — Shumaker & Sieffert, P.A.

(57) ABSTRACT

An article may include a substrate defining at least one at least partially obstructed surface. The substrate includes at least one of a ceramic or a ceramic matrix composite. The article also may include a multilayer, multi-microstructure environmental barrier coating on the at least partially obstructed substrate. The multilayer, multi-microstructure environmental barrier coating includes a first layer comprising a rare earth disilicate and a substantially dense microstructure; and a second layer on the first layer. The second layer includes a columnar microstructure and at least one of a rare earth monosilicate or a thermal barrier coating composition comprising a base oxide comprising zirconia or hafnia; a primary dopant comprising ytterbia; a first co-dopant comprising samaria; and a second co-dopant comprising at least one of lutetia, scandia, ceria, gadolinia, neodymia, or europia.

14 Claims, 7 Drawing Sheets

Related U.S. Application Data (60) Provisional application No. 62/289,064, filed on Jan. 29, 2016.

(51) Int. Cl.

| | | |
|---|---|---|
| *C04B 41/00* | (2006.01) | |
| *C04B 41/45* | (2006.01) | |
| *C04B 41/52* | (2006.01) | |
| *C04B 41/89* | (2006.01) | |
| *C23C 4/02* | (2006.01) | |
| *C23C 4/11* | (2016.01) | |
| *C23C 4/134* | (2016.01) | |
| *C23C 14/08* | (2006.01) | |
| *C23C 14/10* | (2006.01) | |
| *C23C 14/54* | (2006.01) | |
| *F01D 5/28* | (2006.01) | |
| *H01J 37/32* | (2006.01) | |

(52) U.S. Cl.
CPC .............. *C04B 41/52* (2013.01); *C04B 41/89* (2013.01); *C23C 4/02* (2013.01); *C23C 4/11* (2016.01); *C23C 4/134* (2016.01); *C23C 14/083* (2013.01); *C23C 14/10* (2013.01); *C23C 14/548* (2013.01); *F01D 5/28* (2013.01); *H01J 37/32458* (2013.01); *B32B 18/00* (2013.01)

(56) References Cited

U.S. PATENT DOCUMENTS

| | | | |
|---|---|---|---|
| 6,866,897 B2 | 3/2005 | Wang et al. | |
| 7,323,247 B2 | 1/2008 | Raybould et al. | |
| 7,422,671 B2 | 9/2008 | Bhatia et al. | |
| 7,422,819 B2 | 9/2008 | Reisdorf et al. | |
| 7,678,428 B2 | 3/2010 | Barbezat et al. | |
| 7,901,739 B2 | 3/2011 | Fairbourn | |
| 8,173,206 B2 | 5/2012 | Boutwell et al. | |
| 8,859,052 B2 | 10/2014 | Kirby et al. | |
| 8,940,417 B2 | 1/2015 | Courcot et al. | |
| 8,986,779 B2 | 3/2015 | Kirby et al. | |
| 8,986,792 B2 | 3/2015 | Hospach et al. | |
| 2006/0222777 A1 | 10/2006 | Skoog et al. | |
| 2008/0193674 A1 | 8/2008 | Siegert et al. | |
| 2011/0027559 A1 | 2/2011 | Kirby et al. | |
| 2011/0033630 A1 | 2/2011 | Naik et al. | |
| 2011/0052925 A1 | 3/2011 | Sarrafi-Nour et al. | |
| 2011/0200759 A1 | 8/2011 | Tang et al. | |
| 2012/0231211 A1 | 9/2012 | von Niessen et al. | |
| 2012/0308733 A1 | 12/2012 | von Niessen et al. | |
| 2013/0095256 A1 | 4/2013 | Hass et al. | |
| 2013/0136915 A1* | 5/2013 | Naik ..................... | C04B 41/009 427/419.7 |
| 2013/0224393 A1 | 8/2013 | Hospach et al. | |
| 2013/0224432 A1 | 8/2013 | Hospach et al. | |
| 2013/0344319 A1* | 12/2013 | Zhu ..................... | C04B 41/009 428/335 |
| 2014/0011038 A1 | 1/2014 | Das et al. | |
| 2014/0037969 A1 | 2/2014 | Margolies et al. | |
| 2014/0199163 A1* | 7/2014 | Lee ..................... | C04B 41/009 415/174.4 |
| 2014/0255680 A1 | 9/2014 | Lee et al. | |
| 2014/0261080 A1 | 9/2014 | Lee | |
| 2014/0272197 A1 | 9/2014 | Lee | |
| 2014/0329021 A1 | 11/2014 | Lima et al. | |
| 2014/0363684 A1 | 12/2014 | Margolies et al. | |
| 2015/0079370 A1 | 3/2015 | Sun et al. | |
| 2015/0159492 A1 | 6/2015 | Hass | |
| 2017/0130313 A1 | 5/2017 | Gold et al. | |
| 2017/0218501 A1 | 8/2017 | Lee et al. | |
| 2017/0218506 A1 | 8/2017 | Lee et al. | |

FOREIGN PATENT DOCUMENTS

| | | | |
|---|---|---|---|
| EP | 3088560 A1 | 11/2016 | |
| EP | 3165629 A1 | 5/2017 | |

OTHER PUBLICATIONS

Communication Pursuant to Rule 69 EPC, and Invitation to Pursuant to Rule 70a(1) EPC, dated Aug. 7, 2017, from counterpart European Application No. 17152007.5, 2 pp.

Examination Report from counterpart European Application No. 17152007.5, dated Sep. 9, 2020, 4 pp.

Extended Search Report from counterpart European Application No. 17152007.5, dated Jun. 7, 2017, 10 pp.

Goral et al., "PS-PVD deposition of thermal barrier coatings," Surf. Coat. Technol., Proceedings of the 40th International Conference on Metallurgical Coatings and Thin Films (ICMCTF)-ICMCTF 2013, vol. 237, Dec. 25, 2013, 5 pp.

Harder et al., "High Temperature Multilayer Environmental Barrier Coatings Deposited Via Plasma Spray-Physical Vapor Deposition," MS&T 2014, Oct. 12-16, 2014, 17 pp.

Harder et al., "Plasma Spray-Physical Vapor Deposition (PS-PVD) of Ceramics for Protective Coatings", NASA Glenn Research Center, Advanced Ceramic Coatings and Materials for Extreme Environments: Ceramic Engineering and Science Proceedings, vol. 32; Nov. 15, 2011, 11 pp.

Lee et al., "Coating for Engineering Ceramics," Ceramic Gas Turbine Component Dev and Characterization: Progress in Ceramic Turbine Development, vol. 2, 2003 (Applicant points out, in accordance with MPEP 609.04(a), that the year of publication, 2003, is sufficiently earlier than the effective U.S. filing date, Jan. 27, 2017, so that the particular month of publication is not in issue.) Chapter 27, pp. 641-664.

Lee et al., "Upper Temperature Limit of Environmental Barrier Coatings Based on Mullite an BSAS," NASA, Mar. 2002, 26 pp.

Lee et al., "Rare earth silicate environmental barrier coatings for SiC/SiC Composites and Si3N4 ceramics," J. Euro. Ceram. Soc. 25, Jan. 2005, pp. 1705-1715.

Mauer, "Plasma Characteristics and Plasma-Feedstock Interaction Under PS-PVD Process Conditions," Plasma Chemical Plasma Process, Jun. 27, 2014, pp. 1171-1186.

Mauer et al., "Process Development and Coating Characteristics of Plasma Spray-PVD," Surf. Coat. Tech. 220, Apr. 5, 2013, pp. 219-224.

MultiCoat High Performance Thermal Spray Controller, DSE-0043. 9, Oerlikon Metco, Jan. 1, 2015, 8 pp.

Niessen et al., "Vapor phase deposition using a plasma spray process," J. Eng. Gas Turbines Power, vol. 133, Jun. 2011, 7 pp.

Response to Communication pursuant to Rule 69 EPC, and Invitation to Pursuant to Rule 70a(1) EPC, dated Aug. 7, 2017, from counterpart European Application No. 17152007.5, filed Jan. 17, 2018, 11 pp.

Solutions Flash, ChamPro LPPS Hybrid Technologies for Application of Unique, High-Performance Functional Surfaces, SF-0014.2, Oerlikon Metco, Oct. 2014, 12 pp.

"Thermal Spray Equipment Guide," Oerlikon Metco, Issue 11, Oct. 2014, 40 pp.

Zotov et al., "La—Sr—Fe—Co oxygen transport membranes on metal supports deposited by low pressure plasma spraying-physical vapour deposition," Journal of Membrane Sci (2013), vol. 442, Sep. 1, 2013, pp. 119-123.

Prosecution History from U.S. Appl. No. 15/418,393, dated Sep. 6, 2018 through Dec. 18, 2020, 105 pp.

\* cited by examiner

PLASMA SPRAY PHYSICAL VAPOR DEPOSITION DEPOSITED IN MULTILAYER, MULTI-MICROSTRUCTURE ENVIRONMENTAL BARRIER COATING

This application is a divisional of U.S. patent application Ser. No. 15/418,393, filed Jan. 27, 2017, which claims the benefit of U.S. Provisional Application No. 62/289,064 filed Jan. 29, 2016. Each of these applications is incorporated herein by reference in its entirety.

TECHNICAL FIELD

The disclosure relates to techniques for forming multilayer, multi-microstructure environmental barrier coatings using plasma spray physical vapor deposition.

BACKGROUND

Ceramic or ceramic matrix composite (CMC) materials may be useful in a variety of contexts where mechanical and thermal properties are important. For example, components of high temperature mechanical systems, such as gas turbine engines, may be made from ceramic or CMC materials. Ceramic or CMC materials may be resistant to high temperatures, but some ceramic or CMC materials may react with some elements and compounds present in the operating environment of high temperature mechanical systems, such as water vapor. Reaction with water vapor may result in the recession of the ceramic or CMC material. These reactions may damage the ceramic or CMC material and reduce mechanical properties of the ceramic or CMC material, which may reduce the useful lifetime of the component. Thus, in some examples, a ceramic or CMC material may be coated with an environmental barrier coating, which may reduce exposure of the substrate to elements and compounds present in the operating environment of high temperature mechanical systems.

SUMMARY

In some examples, the disclosure describes an article that includes a substrate defining at least one at least partially obstructed surface. The substrate includes at least one of a ceramic or a ceramic matrix composite. The article also may include a multilayer, multi-microstructure environmental barrier coating on the at least partially obstructed substrate. The multilayer, multi-microstructure environmental barrier coating includes a first layer comprising a rare earth disilicate and a substantially dense microstructure and a second layer on the first layer. The second layer includes a columnar microstructure and at least one of a rare earth monosilicate or a thermal barrier coating composition comprising a base oxide comprising zirconia or hafnia; a primary dopant comprising ytterbia; a first co-dopant comprising samaria; and a second co-dopant comprising at least one of lutetia, scandia, ceria, gadolinia, neodymia, or europia.

In some examples, the disclosure describes a system that includes a vacuum pump, a vacuum chamber, a plasma spray device, a coating material source, and a computing device. The computing device is configured to control the vacuum pump to evacuate the vacuum chamber to high vacuum. The computing device also is configured to control the coating material source to provide a first coating material to the plasma spray device at a first feed rate, the first coating material having a composition selected so that a first layer formed from the first coating material comprises a rare earth disilicate, and the first feed rate being selected to result in a substantially dense microstructure for the first layer. Additionally, the computing device is configured to control the plasma spray device to deposit the first layer on a substrate in the vacuum chamber using plasma spray physical vapor deposition, wherein the first layer comprises the rare earth disilicate. The computing device further is configured to control the coating material source to provide a second coating material to the plasma spray device at a second feed rate, the second coating material having a composition selected so that a second layer formed from the second coating material comprises a rare earth monosilicate or a thermal barrier coating composition comprising a base oxide comprising zirconia or hafnia; a primary dopant comprising ytterbia; a first co-dopant comprising samaria; and a second co-dopant comprising at least one of lutetia, scandia, ceria, gadolinia, neodymia, or europia. The computing device also is configured to control the plasma spray device to deposit the second layer on the first layer using plasma spray physical vapor deposition, wherein the second layer comprises the rare earth monosilicate or the thermal barrier coating composition comprising the base oxide comprising zirconia or hafnia; the primary dopant comprising ytterbia; the first co-dopant comprising samaria; and the second co-dopant comprising at least one of lutetia, scandia, ceria, gadolinia, neodymia, or europia.

In some examples, the disclosure describes a method that includes controlling, by a computing device, a vacuum pump to evacuate the vacuum chamber to high vacuum. The method also includes controlling, by the computing device, a coating material source to provide a first coating material to a plasma spray device at a first feed rate, the first coating material having a composition selected so that a first layer from the first coating material comprises a rare earth disilicate, and the first feed rate being selected to result in a substantially dense microstructure for the first layer. Further, the method includes controlling, by the computing device, the plasma spray device to deposit the first layer on a substrate in the vacuum chamber using plasma spray physical vapor deposition, wherein the first layer comprises the rare earth disilicate. The method additionally includes controlling, by the computing device, the coating material source to provide a second coating material to the plasma spray device at a second feed rate, the second coating material having a composition selected so that a second layer formed on the first layer from the second coating material comprises a rare earth monosilicate or a thermal barrier coating composition comprising a base oxide comprising zirconia or hafnia; a primary dopant comprising ytterbia; a first co-dopant comprising samaria; and a second co-dopant comprising at least one of lutetia, scandia, ceria, gadolinia, neodymia, or europia. The method also includes controlling, by the computing device, the plasma spray device to deposit the second layer on the first layer using plasma spray physical vapor deposition, wherein the second layer comprises the rare earth monosilicate or the thermal barrier coating composition comprising the base oxide comprising zirconia or hafnia; the primary dopant comprising ytterbia; the first co-dopant comprising samaria; and the second co-dopant comprising at least one of lutetia, scandia, ceria, gadolinia, neodymia, or europia.

In some examples, the disclosure describes a computer readable storage device including instructions that, when executed, cause a computing device to control a vacuum pump to evacuate the vacuum chamber to high vacuum. The computer readable storage device also includes instructions that, when executed, cause the computing device to control a coating material source to provide a first coating material to a plasma spray device at a first feed rate, the first coating material having a composition selected so that a first layer from the first coating material comprises a rare earth disilicate, and the first feed rate being selected to result in a substantially dense microstructure for the first layer. The computer readable storage device further includes instructions that, when executed, cause the computing device to control the plasma spray device to deposit the first layer on a substrate in the vacuum chamber using plasma spray physical vapor deposition, wherein the first layer comprises the rare earth disilicate. The computer readable storage device additionally includes instructions that, when executed, cause the computing device to control the coating material source to provide a second coating material to the plasma spray device at a second feed rate, the second coating material having a composition selected so that a second layer formed on the first layer from the second coating material comprises a rare earth monosilicate or a thermal barrier coating composition comprising a base oxide comprising zirconia or hafnia; a primary dopant comprising ytterbia; a first co-dopant comprising samaria; and a second co-dopant comprising at least one of lutetia, scandia, ceria, gadolinia, neodymia, or europia. The computer readable storage device also includes instructions that, when executed, cause the computing device to control the plasma spray device to deposit the second layer on the first layer using plasma spray physical vapor deposition, wherein the second layer comprises the rare earth monosilicate or the thermal barrier coating composition comprising the base oxide comprising zirconia or hafnia; the primary dopant comprising ytterbia; the first co-dopant comprising samaria; and the second co-dopant comprising at least one of lutetia, scandia, ceria, gadolinia, neodymia, or europia.

The details of one or more examples are set forth in the accompanying drawings and the description below. Other features, objects, and advantages will be apparent from the description and drawings, and from the claims.

DETAILED DESCRIPTION

The disclosure describes systems and techniques for forming a multilayer, multi-microstructure environmental barrier coating (EBC) using plasma spray physical vapor deposition (PS PVD). EBCs protect ceramic matrix composite (CMC) substrates based on silicon from recession caused by high pressure, high velocity water vapor in environments such as combustion environments in gas turbine engines. Some EBCs are prime reliant coatings, meaning that the EBC must remain on the CMC component for the life of the CMC component. Prime reliant EBCs may fulfill multiple, competing design parameters, including high water vapor stability and thermal expansion compatibility with the underlying CMC. Additionally, some prime reliant EBCs are used on surfaces that are in non-line-of-sight relationship with a coating source during manufacturing. These surfaces are referred to herein as at least partially obstructed surfaces. For example, internal surfaces of gas turbine engine blades, vanes, or bladetracks and areas between doublet or triplet vanes in gas turbine engines may not be able to be put into line-of-sight with a coating source during the manufacture of the coating.

In some examples, PS PVD may be used to deposit a multilayer, multi-microstructure EBC on surfaces of a CMC, including non-line-of-sight (NLOS) or at least partially obstructed surfaces of the CMC. Additionally, PS PVD is a flexible process that allows relatively easy adjustment of process parameters to result in coatings with different chemistry, microstructure, or both. In this way, PS PVD may be used to deposit a multilayer, multi-microstructure EBC that provides desired high water vapor stability and thermal expansion compatibility with the underlying CMC in a relatively fast, relatively cost-effective process.

In some examples, a first layer (closer to the underlying CMC) of the multilayer, multi-microstructure EBC includes at least one rare earth disilicate and a substantially dense microstructure. A second layer (further from the underlying CMC) of the multilayer, multi-microstructure EBC may include a columnar microstructure, and may include at least one of a rare earth monosilicate or a thermal barrier coating composition comprising rare earth oxide-stabilized hafnia or rare earth oxide-stabilized zirconia. The at least one rare earth disilicate may have good thermal expansion compatibility with the underlying CMC, e.g., better than the at least one rare earth monosilicate or the low thermal conductivity thermal barrier coating composition. Further, by including a substantially dense microstructure, the first layer may provide a diffusion barrier for any water vapor that reaches the surface of the first layer.

The at least one of the rare earth monosilicate or the thermal barrier coating composition comprising rare earth oxide-stabilized hafnia or rare earth oxide-stabilized zirconia may have good water vapor stability, e.g., better than the rare earth disilicate. The columnar microstructure of the second layer may mitigate stress due to thermal expansion mismatch between the second layer and the first layer. Further, presence of the second layer may result in reduced velocity of water vapor at the surface of the first layer, reducing or substantially preventing recession of the first layer.

Figure 1:
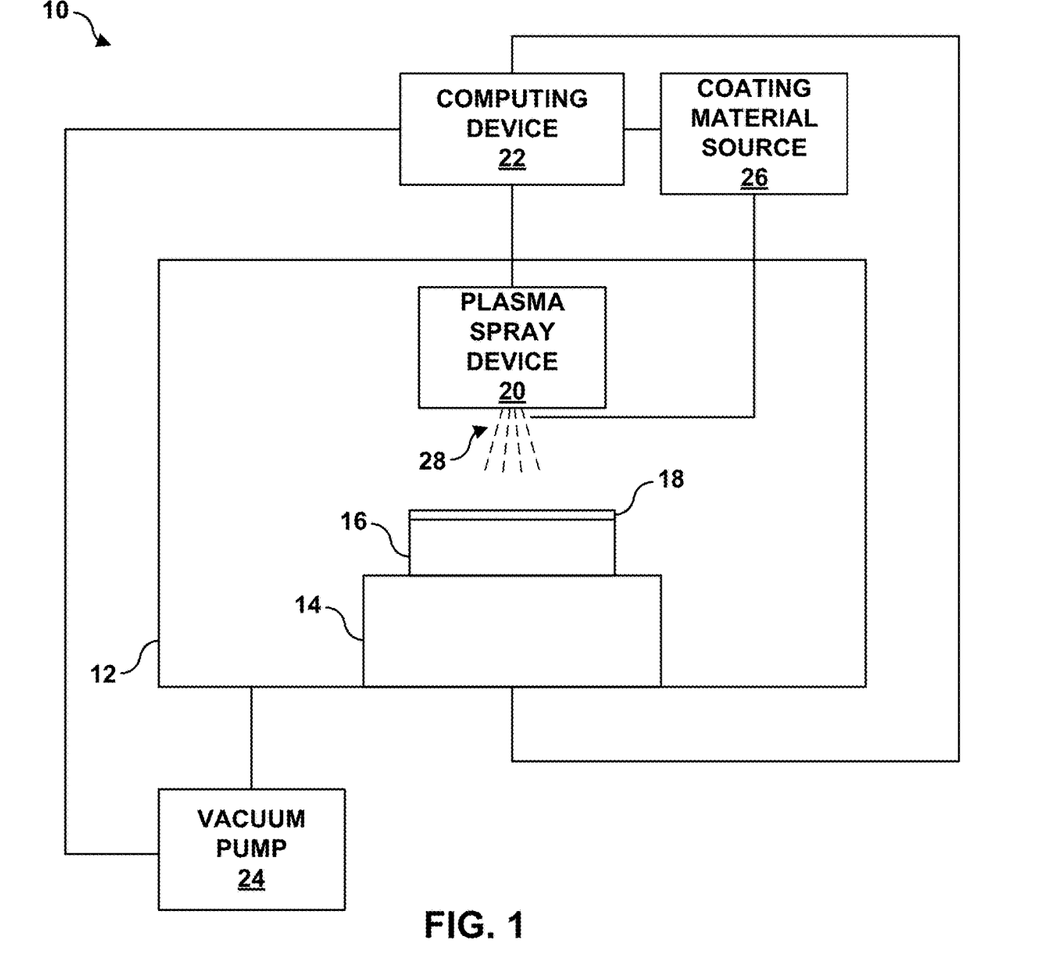
FIG. 1 is a conceptual and schematic diagram illustrating an example system for forming a multilayer, multi-microstructure environmental barrier coating using plasma spray physical vapor deposition.

FIG. 1 is a conceptual and schematic diagram illustrating an example system 10 for forming a multilayer, multi-microstructure EBC 18 using PS PVD. System 10 includes a vacuum chamber 12, which encloses a stage 14 and a plasma spray device 20. System 10 also includes a vacuum pump 24, a coating material source 26, and a computing device 22. A substrate 16 is disposed in vacuum chamber 12 and includes multilayer, multi-microstructure EBC 18.

Vacuum chamber 12 may substantially enclose (e.g., enclose or nearly enclose) stage 14, substrate 16, and plasma spray device 20. Vacuum chamber 12 is fluidically connected to at least one vacuum pump 24, which is operable to pump fluid (e.g., gases) from the interior of vacuum chamber 12 to establish a vacuum in vacuum chamber 12. In some examples, vacuum pump 24 may include multiple pumps or multiple stages of a pump, which together may evacuate vacuum chamber 12 to high vacuum. For example, vacuum pump 24 may include at least one of a scroll pump, a screw pump, a roots pump, a turbomolecular pump, or the like. As used herein, high vacuum may refer to pressures of less than about 10 torr (less than about 1.33 kilopascals (kPa)). In some examples, the pressure within vacuum chamber 12 during the PS-PVD technique may be between about 0.5 torr (about 66.7 pascals) and about 10 torr (about 1.33 kPa).

In some examples, during the evacuation process, vacuum chamber 12 may be backfilled with a substantially inert atmosphere (e.g., helium, argon, or the like), then the substantially inert gases removed during subsequent evacuation to the target pressure (e.g., high vacuum). In this way, the gas molecules remaining in vacuum chamber 12 under high vacuum may be substantially inert, e.g., to substrate 16 and multilayer, multi-microstructure EBC 18.

In some examples, stage 14 may be configured to selectively position and restrain substrate 16 in place relative to stage 14 during formation of multilayer, multi-microstructure EBC 18. In some examples, stage 14 is movable relative to plasma spray device 20. For example, stage 14 may be translatable and/or rotatable along at least one axis to position substrate 16 relative to plasma spray device 20. Similarly, in some examples, plasma spray device 20 may be movable relative to stage 14 to position plasma spray device 20 relative to substrate 16.

Plasma spray device 20 includes a device used to generate a plasma 28 for use in the PS PVD technique. For example, plasma spray device 20 may include a plasma spray gun including a cathode and an anode separated by a plasma gas channel. As the plasma gas flows through the plasma gas channel, a voltage may be applied between the cathode and anode to cause the plasma gas to form the plasma 28. In some examples, the coating material may be injected inside plasma spray device 20 such that the coating material flows through part of the plasma gas channel. In some examples, the coating material may be introduced to the plasma external to plasma spray device 20, as shown in FIG. 1. In some examples, the coating material may be a relatively fine powder (e.g., an average particle size of less than about 5 micrometers) to facilitate vaporization of the coating material by the plasma. In some examples, the relatively fine powder may be agglomerated into a composite powder that serves as the material fed to plasma spray device 20. The composite powder may have a particle size that is larger than the relatively fine powder.

Coating material source 26 may include at least one source of material which is injected into the plasma 28 generated by plasma spray device 20 and deposited in a layer of multilayer, multi-microstructure EBC 18 on substrate 16. In some examples, the material may be in powder form, and may be supplied by coating material source 26 carried by a fluid, such as air, an inert gas, or the like. In some examples, system 10 may include multiple coating material sources, e.g., one coating material source for each layer of multilayer, multi-microstructure EBC 18.

The multilayer, multi-microstructure EBC 18 may include a first layer including at least one rare earth disilicate ($RE_2Si_2O_7$, where RE is a rare earth element selected from the group consisting of lutetium, ytterbium, thulium, erbium, holmium, dysprosium, terbium, gadolinium, europium, samarium, promethium, neodymium, praseodymium, cerium, lanthanum, yttrium, and scandium). The multilayer, multi-microstructure EBC 18 also may include a second layer including at least one rare earth monosilicate ($RE_2SiO_5$, where RE is a rare earth element selected from the group consisting of lutetium, ytterbium, thulium, erbium, holmium, dysprosium, terbium, gadolinium, europium, samarium, promethium, neodymium, praseodymium, cerium, lanthanum, yttrium, and scandium) or a thermal barrier coating composition comprising rare earth oxide-stabilized hafnia or rare earth oxide-stabilized zirconia. In examples in which the first layer includes at least one rare earth disilicate and the second layer includes at least one rare earth monosilicate, the rare earth element in the rare earth silicates may be the same or may be different. As such, in some examples, system 10 may include a single coating material source 26. In other examples, system 10 may include multiple coating material sources 26, e.g., one coating material source for each distinct layer chemistry.

In some examples, the coating material for a layer including at least one rare earth disilicate or at least one rare earth monosilicate may include particles, such as particles including a rare earth oxide, particles that include silica, or both, where the particles including rare earth oxide are separate from the particles including silica, and are mechanically mixed in a powder mixture. In other examples, the coating material for a layer including at least one rare earth disilicate or at least one rare earth monosilicate may include particles in which rare earth oxide and silica are chemically reacted in the form of rare earth monosilicate or rare earth disilicate. In other examples, the particles including rare earth oxide may be agglomerated with particles including silica to form larger particles. For example, particles of rare earth oxide and particles of silica may be mixed and agglomerated such that the agglomerated particles include a ratio of moles of rare earth oxide to moles of silica in an approximately stoichiometric amount for the selected type of silicate (e.g., a rare earth monosilicate or a rare earth disilicate).

In some examples, a coating material provided by coating material source 26 may include additional and optional constituents of a layer of multilayer, multi-microstructure EBC 18. For example, the additional and optional constituents in a layer including at least one rare earth disilicate or at least one rare earth monosilicate may include alumina, an alkali metal oxide, an alkaline earth metal oxide, $TiO_2$, $Ta_2O_5$, $HfSiO_4$, or the like. The additive may be added to the layer to modify one or more desired properties of the layer. For example, the additive components may increase or decrease the reaction rate of the layer with calcia-magnesia-alumina-silicate (CMAS; a contaminant that may be present in intake gases of gas turbine engines), may modify the viscosity of the reaction product from the reaction of CMAS and constituent(s) of the layer, may increase adhesion of the layer to an adjacent layer, may increase the chemical stability of the layer, may decrease steam oxidation rate, or the like.

Computing device 22 may include, for example, a desktop computer, a laptop computer, a workstation, a server, a mainframe, a cloud computing system, or the like. Computing device 22 may include or may be one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some examples, the functionality of computing device 22 may be provided within dedicated hardware and/or software modules.

Computing device 22 is configured to control operation of system 10, including, for example, stage 14, plasma spray device 20, and/or vacuum pump 24. Computing device 22 may be communicatively coupled to at least one of stage 14, plasma spray device 20, and/or vacuum pump 24 using respective communication connections. Such connections may be wireless and/or wired connections.

Computing device 22 may be configured to control operation of stage 14 and/or plasma spray device 20 to position substrate 16 relative to plasma spray device 20. For example, as described above, computing device 22 may control plasma spray device 20 to translate and/or rotate along at least one axis to position substrate 16 relative to plasma spray device 20.

As described above, system 10 may be configured to perform a PS PVD technique to deposit multilayer, multi-microstructure EBC 18 on substrate 16. In some examples, substrate 16 may include component of a high temperature mechanical system, such as a gas turbine engine. For example, substrate 16 may be part of a seal segment, a blade track, an airfoil, a blade, a vane, a combustion chamber liner, or the like. In some examples, substrate may include a ceramic or a CMC. Example ceramic materials may include, for example, silicon carbide (SiC), silicon nitride ($Si_3N_4$), alumina ($Al_2O_3$), aluminosilicate, silica ($SiO_2$), transition metal carbides and silicides (e.g. WC, $Mo_2C$, TiC, $MoSi_2$, $NbSi_2$, $TiSi_2$), or the like. In some examples, substrate 16 additionally may include silicon metal, carbon, or the like. In some examples, substrate 16 may include mixtures of two or more of SiC, $Si_3N_4$, $Al_2O_3$, aluminosilicate, silica, silicon metal, carbon, or the like.

In examples in which substrate 16 includes a CMC, substrate 16 includes a matrix material and a reinforcement material. The matrix material includes a ceramic material, such as, for example, silicon metal, SiC, or other ceramics described herein. The CMC further includes a continuous or discontinuous reinforcement material. For example, the reinforcement material may include discontinuous whiskers, platelets, fibers, or particulates. As other examples, the reinforcement material may include a continuous monofilament or multifilament weave. In some examples, the reinforcement material may include SiC, C, other ceramic materials described herein, or the like. In some examples, substrate 16 includes a SiC—SiC ceramic matrix composite.

System 10 may be used to perform PS PVD to deposit multilayer, multi-microstructure EBC 18 on surfaces of substrate 16, including NLOS surfaces of substrate 16. PS PVD is a flexible process that allows relatively easy adjustment of process parameters to result in coatings with different chemistry, microstructure, or both. In this way, system 10 may utilize PS PVD to deposit multilayer, multi-microstructure EBC 18 that provides desired high water vapor stability and thermal expansion compatibility with the underlying CMC in a relatively fast, relatively cost-effective process.

Computing device 22 may be configured to control operation of system 10 (e.g., vacuum pump 24, plasma spray device 20, and coating material source 26) to perform PS PVD to deposit the EBC 18. PS PVD may operate at low operating pressures, such as between about 0.5 torr and about 10 torr. In some examples, the temperatures of the plasma may be greater than about 6000 K, which may vaporize the coating material. Because the vaporized coating material is carried by a gas stream, PS PVD may allow deposition multilayer, multi-microstructure EBC 18 on surfaces of substrate 16 that are not in line-of-sight relationship with plasma spray device 20, unlike thermal spray processes, such as air plasma spraying. Further, a deposition rate (e.g., thickness of coating deposited per unit time) may be greater for PS PVD than for other vapor phase deposition processes, such as chemical vapor deposition or physical vapor deposition, which may result in PS PVD being a more economical coating technique.

In some examples, multilayer, multi-microstructure EBC 18 includes a first layer (closer to the underlying CMC) that includes at least one rare earth disilicate and a substantially dense microstructure. The at least one rare earth disilicate may have good thermal expansion compatibility with the underlying CMC, e.g., better than the at least one rare earth monosilicate or the low thermal conductivity thermal barrier coating composition. Further, by including a substantially dense microstructure, the first layer may substantially prevent (e.g., prevent or nearly prevent) environmental species such as water vapor, oxygen, molten salt, or calcia-magnesia-alumina-silicate (CMAS) deposits from contacting substrate 16 and degrading the material structure of substrate 16. For example, water vapor may react with a substrate 16 including a CMC and volatilize silica or alumina components in substrate 16. Consequently, a first layer which is substantially dense (e.g., substantially nonporous) may provide protection to substrate 16 by preventing water vapor from contacting and reacting with substrate 16. In some examples, a layer with a substantially dense microstructure may have a porosity of less than about 10 vol. %, such as, e.g., less than about 5 vol. %, where porosity is measured as a percentage of pore volume divided by total layer volume.

System 10 may utilize PS PVD to deposit the first layer. For example, the rate at which coating material is fed by coating material source 26 into plasma 28 may affect the amount of the coating material that is vaporized by plasma 28. A higher rate of coating material being fed into plasma 28 may reduce the amount of the coating material that is vaporized by plasma 28. When substantially all of the coating material is vaporized, the resulting deposited layer may be substantially dense, while when less coating material is vaporized, the resulting deposited layer may have a columnar microstructure. Hence, by reducing the rate of coating material fed by coating material source 26 into plasma 28, computing device 22 may cause a first layer having a substantially dense microstructure to be deposited on substrate 16.

In some examples, multilayer, multi-microstructure EBC 18 also includes a second layer (further from the underlying CMC) that may include a columnar microstructure, and may include at least one of a rare earth monosilicate or a thermal barrier coating composition comprising rare earth oxide-stabilized hafnia or rare earth oxide-stabilized zirconia. The at least one of the rare earth monosilicate or the thermal barrier coating composition comprising rare earth oxide-stabilized hafnia or rare earth oxide-stabilized zirconia may have good water vapor stability, e.g., better than the at least one rare earth disilicate. A columnar microstructure may have microcracks or microgaps that extend through at least a portion of the layer in a direction that is substantially orthogonal to the plane defined by the layer surface. Because of the microgaps, a columnar microstructure may have enhanced mechanical compliance under thermal cycling or when a temperature gradient exists, such as when a high-temperature system is first engaged. Additionally, a layer having a columnar microstructure may provide improved thermal protection to substrate 16 compared to a layer that is substantially nonporous. While not wishing to be bound by theory, the microcracks or microgaps may provide scattering sites for thermal energy-carrying phonons, which may lower an effective thermal conductivity of a layer having a columnar microstructure compared to a substantially nonporous layer of a similar composition. Further, presence of the second layer may result in reduced velocity of water vapor at the surface of the first layer, reducing or substantially preventing recession of the first layer.

In some examples, thermal protection and mechanical compliance are not the only benefits of a columnar microstructure EBC. An EBC having a columnar microstructure may also exhibit enhanced erosion resistance and enhanced sintering resistance relative to an EBC that does not include a columnar microstructure.

System 10 may utilize PS PVD to deposit the second layer. For example, computing device 22 may cause coating material source 26 to feed coating material into plasma 28 at higher rate so that less than all of the coating material is vaporized by plasma 28. When less coating material is vaporized, the resulting deposited layer may have a columnar microstructure. Hence, by increasing the rate of coating material fed by coating material source 26 into plasma 28, computing device 22 may cause a second layer having a columnar microstructure to be deposited on substrate 16.

In this way, system 10 may utilize PS PVD to deposit multilayer, multi-microstructure EBC 18 on substrate 16, where multilayer, multi-microstructure EBC 18 includes a first layer including at least one rare earth disilicate and a substantially dense microstructure and a second layer including a columnar microstructure and at least one rare earth monosilicate or a thermal barrier coating composition comprising rare earth oxide-stabilized hafnia or rare earth oxide-stabilized zirconia. In some examples, system 10 may utilize PS PVD to deposit multilayer, multi-microstructure EBC 18 on NLOS surfaces of substrate 16, which may not be possible with EB-PVD (electron beam physical vapor deposition) techniques often used to deposit columnar coating layers.

In some examples in which a layer of multilayer, multi-microstructure EBC 18 includes at least one rare earth disilicate or at least one rare earth monosilicate, the coating material may include excess silica compared to the desired amount of silica in the layer of multilayer, multi-microstructure EBC 18 (e.g., in the monosilicate or disilicate). In some examples, the excess silica may be mixed in the coating material as a separate powder. In other examples, the excess silica may be part of an agglomerate with the rare earth oxide.

The excess silica in the coating source may facilitate formation of a layer with a desired composition. As described above, silica may have a higher vapor pressure than rare earth oxides, at a given pressure and temperature. This may result in silica being more likely to be lost via volatilization during the processing, such that silica deposits in the layer in a lower ratio than the ratio of silica in the coating material. Thus, by including excess silica in a predetermined amount, a layer may be formed with a desired amount of silica. For example, the excess amount of silica may be selected such that the ratio of silica to earth oxide deposited in the first layer is substantially the same as a stoichiometric ratio of the desired rare earth disilicate. In other examples, the amount of silica in the coating material may be selected to result in a predetermined amount of excess silica or excess rare earth oxide in the layer being deposited compared to a stoichiometric ratio of rare earth oxide to silica in the desired rare earth silicate. This may result in a selected amount of free silica or free rare earth oxide in the layer of multilayer, multi-microstructure EBC 18.

The amount of excess silica included in the coating material may depend on the desired composition of the layer in multilayer, multi-microstructure EBC 18, and may be based on experimental testing. For example, a first coating material having a first ratio of silica to rare earth oxide may be formed and a coating deposited from the coating material using PS PVD. The composition of the resulting coating may be determined, and the ratio of silica to rare earth oxide (e.g., in the form of a rare earth silicate) in the coating may be compared to the ratio of silica to rare earth oxide in the coating material. This process may be repeated to determine an amount of excess silica to include in the coating material to form the layer in multilayer, multi-microstructure EBC 18 with a desired composition.

Figure 2:
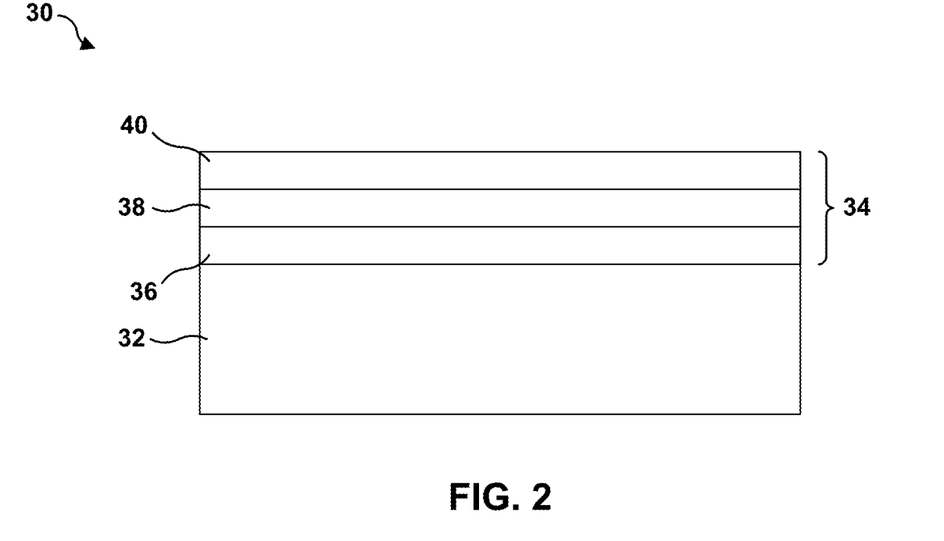
FIG. 2 is a conceptual block diagram illustrating an example article including a substrate and a multilayer, multi-microstructure environmental barrier coating including a first, substantially dense layer, and a second, columnar layer.
Figure 3:
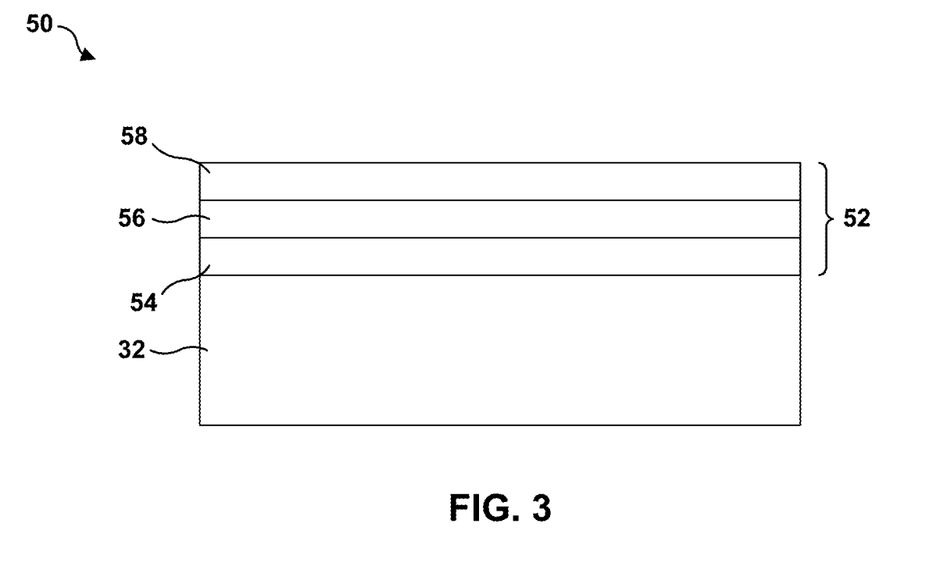
FIG. 3 is a conceptual block diagram illustrating an example article including a substrate and a multilayer, multi-microstructure environmental barrier coating including a first, substantially dense layer, a second, columnar layer, and a third, columnar layer.
Figure 4:
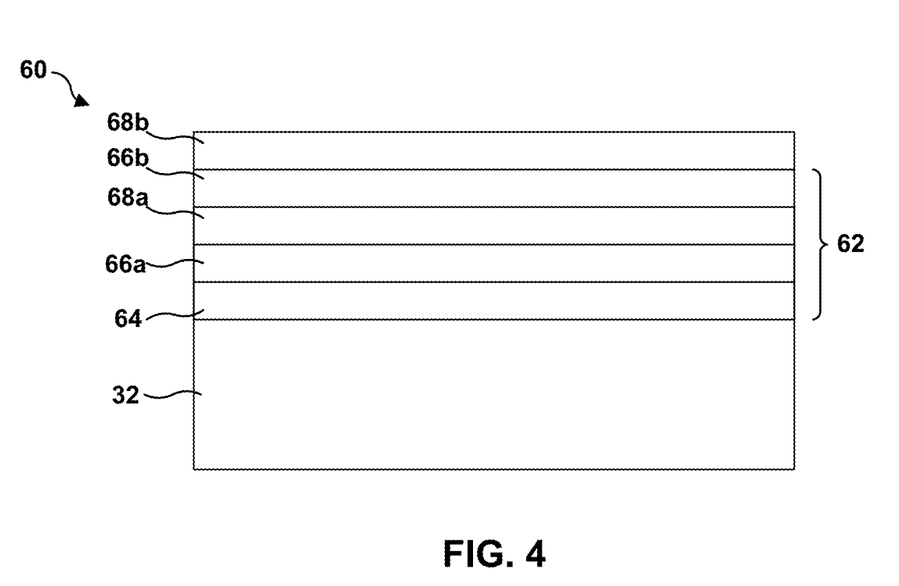
FIG. 4 is a conceptual block diagram illustrating an example article including a substrate and a multilayer, multi-microstructure environmental barrier coating including a first, substantially dense layer, and a plurality of columnar layers.

Multilayer, multi-microstructure EBC 18 may include a first layer and a second layer, and also may include one or more optional layers, as shown in FIGS. 2-4. FIG. 2 is a conceptual block diagram illustrating an example article 30 including a substrate 32 and a coating 34 that includes a multilayer, multi-microstructure EBC including a first layer 38 and a second layer 40. Substrate 32 may include any of the materials described above with respect to substrate 16 of FIG. 1.

Coating 34 also includes an optional bond coat 36. Bond coat 36 may include, for example, silicon metal, alone, or mixed with at least one other constituent. For example, bond coat 36 may include silicon metal and at least one of a transition metal carbide, a transition metal boride, a transition metal nitride, mullite (aluminum silicate, $Al_6Si_2O_{13}$), silica, a silicide, an oxide (e.g., silicon oxide, a rare earth oxide, an alkali oxide, an alkali earth metal oxide, or the like), a silicate (e.g., a rare earth silicate or the like), or the like. In some examples, the additional constituent(s) may be substantially homogeneously mixed with silicon metal. In other examples, the additional constituent(s) may form a second phase distinct from the silicon metal phase.

As described above, first layer 38 includes at least one rare earth disilicate and a substantially dense microstructure. A rare earth disilicate is a compound formed by chemically reacting a rare earth oxide and silica in a particular stoichiometric ratio (1 mole rare earth oxide and 2 moles silica) under sufficient conditions (e.g., heat and/or pressure) to cause the rare earth oxide and the silica to react. A rare earth disilicate is chemically distinct from a mixture of free rare earth oxide and free silica. For example, a rare earth disilicate has different chemical and physical properties than a mixture of free rare earth oxide and free silica.

In some examples, first layer 38 may consist essentially of or consist of the at least one rare earth disilicate. In other examples, first layer 38 may include the at least one rare earth disilicate and at least one other element or compound. For example, first layer 38 may include the rare earth disilicate and at least one of free rare earth oxide, free silica, or rare earth monosilicate.

Additionally and optionally, first layer 38 may include at least one dopant. The at least one dopant may include at least one of alumina ($Al_2O_3$), at least one alkali oxide, or at least one alkaline earth oxide. In some examples, first layer 38 may include between about 0.1 wt. % and about 5 wt. % of the at least one dopant. In some examples in which the at least one dopant includes alumina, first layer 38 may include between about 0.5 wt. % and about 3 wt. % alumina or between about 0.5 wt. % and about 1 wt. % alumina. In some examples in which the at least one dopant includes the at least one alkali oxide, first layer 38 may include between about 0.1 wt. % and about 1 wt. % of the at least one alkali oxide. In some examples in which the at least one dopant includes the at least one alkaline earth oxide, first layer 38 may include between about 0.1 wt. % and about 1 wt. % of the at least one alkaline earth oxide. The at least one dopant may affect chemical and physical properties of first layer 38, including, for example, steam oxidation resistance, calcia-magnesia-alumina-silicate (CMAS) resistance, thermal expansion coefficient, and the like.

First layer 38 includes a substantially dense microstructure. In some examples, first layer 38 with a substantially dense microstructure may have a porosity of less than about 10 vol. %, such as, e.g., less than about 5 vol. %, where porosity is measured as a percentage of pore volume divided by total layer volume.

Second layer 40 includes a columnar microstructure and at least one rare earth monosilicate or a thermal barrier coating composition including a rare earth oxide-stabilized zirconia or a rare earth oxide-stabilized hafnia. A columnar microstructure may have microcracks or microgaps that extend through at least a portion of the layer in a direction that is substantially orthogonal to the plane defined by the layer surface. Because of the microgaps, a columnar microstructure may have enhanced mechanical compliance under thermal cycling or when a temperature gradient exists, such as when a high-temperature system is first engaged. Additionally, a layer having a columnar microstructure may provide improved thermal protection to substrate 16 compared to a layer that is substantially nonporous.

A rare earth monosilicate is a compound formed by chemically reacting a rare earth oxide and silica in a particular stoichiometric ratio (1 mole rare earth oxide and 1 mole silica) under sufficient conditions (e.g., heat and/or pressure) to cause the rare earth oxide and the silica to react. A rare earth monosilicate is chemically distinct from a mixture of free rare earth oxide and free silica. For example, a rare earth monosilicate has different chemical and physical properties than a mixture of free rare earth oxide and free silica.

In some examples, second layer 40 may consist essentially of or consist of the at least one rare earth monosilicate. In other examples, second layer 40 may include the at least one rare earth monosilicate and at least one other element or compound. For example, second layer 40 may include the rare earth monosilicate and at least one of free rare earth oxide, free silica, or rare earth disilicate.

The thermal barrier coating composition including a rare earth oxide-stabilized zirconia or a rare earth oxide-stabilized hafnia may include a base oxide, a primary dopant, a first co-dopant, and a second co-dopant. In some examples, the primary dopant, first co-dopant, and second co-dopant may be rare earth oxides. The base oxide may be zirconia or hafnia. The primary dopant may be ytterbia, the first co-dopant samaria, and the second co-dopant may be at least one of lutetia, scandia, ceria, gadolinia, neodymia, or europia. Additionally, in some examples, the thermal barrier coating composition may be essentially free of yttria.

The inclusion of rare earth oxides such as ytterbia, samaria, lutetia, scandia, ceria, gadolinia, neodymia, europia, and the like as dopants may help decrease the thermal conductivity (by conduction) of the thermal barrier coating composition. While not wishing to be bound by any specific theory, the inclusion of at least one of these dopant oxides in the thermal barrier coating composition may reduce thermal conductivity through one or more mechanisms, as follows.

A first proposed mechanism of reducing thermal conductivity includes introducing lattice imperfections into the crystal structure of the thermal barrier coating composition. Lattice imperfections include defects in the crystalline lattice of the thermal barrier coating composition. The defects may be caused by the incorporation of dopants with differing ionic radii, different atomic weight, or different crystalline lattice types. Phonon scattering decreases the thermal conductivity of second layer 40 by reducing the mean free path of a phonon (i.e., the average distance the phonon travels between scattering sites).

Heavier rare earth oxide dopants are expected to lower the thermal conductivity more than lighter rare earth oxide dopants. For example, rare earth oxides including ytterbia, lutetia, gadolinia, samaria, neodymia, europia, and the like are expected to more effectively lower the thermal conductivity of the thermal barrier coating composition than yttria.

Inclusion of certain rare earth elements in the thermal barrier coating composition may also decrease the extent to which second layer 40 sinters at a given temperature. For example, incorporating rare earth elements with a larger ionic radius than yttrium can decrease the amount of sintering at a given temperature. While not wishing to be bound by any theory, a larger ionic radius can lead to a lower diffusion coefficient at a given temperature. As sintering is primarily a diffusion-related process, a lower diffusion coefficient lowers the amount of sintering at a given temperature.

Minimizing or eliminating sintering may significantly improve the stability of the thermal conductivity of second layer 40 over the service life of second layer 40. Thermal conductivity of second layer 40 is lowered by forming second layer 40 as a columnar structure. The columnar structure of second layer 40 reduces the thermal conductivity by reducing the area through which heat is conducted and by providing a large refractive index difference between the gaps and the material from which second layer 40 is made, which can reduce heat transfer by radiation. Sintering reduces the gaps in the structure, and thus increases the thermal conductivity (via both radiation and conduction) of second layer 40.

In order to accomplish at least some of the desired properties mentioned above, second layer 40, when including the thermal barrier coating composition, may include a composition that includes a base oxide, a primary dopant, a first co-dopant, and a second co-dopant. In some examples, second layer 40 may consist essentially of the thermal barrier coating composition, which may consist essentially of the base oxide, the primary dopant, the first co-dopant, and the second co-dopant. In the current disclosure, to "consist essentially of" means to consist of the listed element(s) or compound(s), while allowing the inclusion of impurities present in small amounts such that the impurities do not substantially affect the properties of the listed element or compound. For example, the purification of many rare earth elements is difficult, and thus the nominal rare earth element may include small amounts of other rare earth elements. This mixture is intended to be covered by the language "consist essentially of."

The base oxide may include or consist essentially of zirconia and/or hafnia. The primary dopant may include or consist essentially of ytterbia. The first co-dopant may include or consist essentially of samaria, and second co-dopant may include or consist essentially of at least one of lutetia, scandia, ceria, gadolinia, neodymia, or europia. In some examples, second layer 40 may include zirconia and/or hafnia in combination with additive elements or compounds such that at least some of the stabilized zirconia or hafnia forms a metastable tetragonal-prime crystalline phase, a cubic crystalline phase, or a compound phase ($RE_2Zr_2O_7$ or $RE_2Hf_2O_7$, where RE is a rare earth element).

In some examples, second layer 40 may consist essentially of a base oxide, a primary dopant, a first co-dopant, and a second co-dopant. The base oxide may be selected from zirconia, hafnia, and combinations thereof. The primary dopant may consist essentially of ytterbia. The first co-dopant may consist essentially of samaria. The second co-dopant may be selected from at least one of lutetia, scandia, ceria, gadolinia, neodymia, or europia. Second layer 40 may be essentially free of yttria.

In some examples, the primary dopant is present in second layer 40 in an amount greater than either the first co-dopant or the second co-dopant. In various examples, the primary dopant may be present in an amount less than, equal to, or greater than the total amount of the first co-dopant and the second co-dopant.

In some examples, second layer 40 includes between about 2 mol. % and about 40 mol. % of the primary dopant. In other examples, second layer 40 includes between about 20 mol. % and about 40 mol. % of the primary dopant, between about 2 mol. % and about 20 mol. % of the primary dopant, between about 2 mol. % and about 10 mol. % of the primary dopant, between about 2 mol. % and about 5 mol. % of the primary dopant.

In some examples, second layer 40 includes between about 0.1 mol. % and about 20 mol. % of the first co-dopant. In other examples, second layer 40 includes between about 10 mol. % and about 20 mol. % of the first co-dopant, between about 2 mol. % and about 10 mol. % of the first co-dopant or between about 0.5 mol. % and about 3 mol. % of the first co-dopant.

In some examples, second layer 40 includes between about 0.1 mol. % and about 20 mol. % of the second co-dopant. In other examples, second layer 40 includes between about 10 mol. % and about 20 mol. % of the second co-dopant, between about 2 mol. % and about 10 mol. % of the second co-dopant, or between about 0.5 mol. % and about 3 mol. % of the second co-dopant.

The composition of second layer 40 provides a desired phase constitution. For a second layer 40 that includes zirconia and/or hafnia, a primary dopant, a first co-dopant, and a second co-dopant, accessible phase constitutions include metastable tetragonal-prime, cubic, and compound ($RE_2Zr_2O_7$ and $RE_2Hf_2O_7$, where RE is a rare earth element). To achieve a $RE_2O_3$—$ZrO_2$ (and/or $HfO_2$) compound phase constitution, second layer 40 includes between about 20 mol. % and about 40 mol. % primary dopant, between about 10 mol. % and about 20 mol. % first co-dopant, between about 10 mol. % and about 20 mol. % second co-dopant, and the balance base oxide (hafnia and/or zirconia) and any impurities present. To achieve a cubic phase constitution, second layer 40 includes between about 4 mol. % and about 10 mol. % primary dopant, between about 1 mol. % and about 5 mol. % first co-dopant, between about 1 mol. % and about 5 mol. % second co-dopant, and a balance base oxide (zirconia and/or hafnia) and any impurities present. In some examples, to achieve a metastable tetragonal phase constitution, second layer 40 includes between about 2 mol. % and about 5 mol. % primary dopant, between about 0.5 mol. % and about 3 mol. % first co-dopant, between about 0.5 mol. % and about 3 mol. % second co-dopant, and a balance base oxide and any impurities present.

Additionally and optionally, second layer 40 may include at least one dopant. The at least one dopant may include at least one of alumina ($Al_2O_3$), at least one alkali oxide, or at least one alkaline earth oxide. In some examples, second layer 40 may include between about 0.1 wt. % and about 5 wt. % of the at least one dopant. In some examples in which the at least one dopant includes alumina, second layer 40 may include between about 0.5 wt. % and about 3 wt. % alumina or between about 0.5 wt. % and about 1 wt. % alumina. In some examples in which the at least one dopant includes the at least one alkali oxide, second layer 40 may include between about 0.1 wt. % and about 1 wt. % of the at least one alkali oxide. In some examples in which the at least one dopant includes the at least one alkaline earth oxide, second layer 40 may include between about 0.1 wt. % and about 1 wt. % of the at least one alkaline earth oxide. The at least one dopant may affect chemical and physical properties of second layer 40, including, for example, steam oxidation resistance, calcia-magnesia-alumina-silicate (CMAS) resistance, thermal expansion coefficient, and the like.

In some examples, multilayer, multi-microstructure EBC may include more than two layers. For example, FIG. 3 is a conceptual block diagram illustrating an example article 50 that includes a substrate 32 and a multilayer, multi-microstructure environmental barrier coating 52 including a first, substantially dense layer 54, a second, columnar layer 56, and a third, columnar layer 58. Substrate 32 is the same as substrate 32 of FIG. 2.

First, substantially dense layer 54 may be similar to or substantially the same as first layer 38 of FIG. 2. For example, first, substantially dense layer 54 may include a rare earth disilicate. Second, columnar layer 56 may include at least one rare earth monosilicate and a columnar microstructure, as described with respect to second layer 40 of FIG. 2. Third, columnar layer 58 may include a thermal barrier coating composition including at least one of rare earth oxide-stabilized zirconia or rare earth oxide-stabilized hafnia and a columnar microstructure, as described with respect to second layer 40 of FIG. 2.

The rare earth monosilicate in second, columnar layer 56 may have a coefficient of thermal expansion that is greater than the coefficient of thermal expansion of the rare earth disilicate in first, substantially dense layer 54. Moreover, the rare earth monosilicate in second, columnar layer 56 may have a coefficient of thermal expansion that is less than the coefficient of thermal expansion of the thermal barrier coating composition including at least one of rare earth oxide-stabilized zirconia or rare earth oxide-stabilized hafnia in third, columnar layer 58. In this way, second, columnar layer 56 may be a layer with an intermediate coefficient of thermal expansion, which may result in reduced stresses within multilayer, multi-microstructure environmental barrier coating 52 during thermal cycling than if third, columnar layer 58 were directly adjacent to first, substantially dense layer 54. The thermal barrier coating composition including at least one of rare earth oxide-stabilized zirconia or rare earth oxide-stabilized hafnia in third, columnar layer 58 may have a lower thermal conductivity and better water vapor stability at very high temperatures than the rare earth monosilicate in second, columnar layer 56.

FIG. 4 is a conceptual block diagram illustrating an example article 60 including a substrate 32 and a multilayer, multi-microstructure environmental barrier coating 62 including a first, substantially dense layer 64, and a plurality of columnar layers 66a, 66b, 68a, and 68b. Substrate 32 is the same as substrate 32 of FIG. 2.

First, substantially dense layer 64 may be similar to or substantially the same as first layer 38 of FIG. 2. For example, first, substantially dense layer 64 may include a rare earth disilicate. First set of columnar layers 66a and 66b may include at least one rare earth monosilicate and a columnar microstructure, as described with respect to second layer 40 of FIG. 2. Second set of columnar layers 68a and 68b may include a thermal barrier coating composition including at least one of rare earth oxide-stabilized zirconia or rare earth oxide-stabilized hafnia and a columnar microstructure, as described with respect to second layer 40 of FIG. 2.

By alternating layers of first set of columnar layers 66 and layers of second set of columnar layers 68, interfaces will be formed between adjacent layers. These interfaces provide phonon scattering, which reduces thermal conductivity of multilayer, multi-microstructure environmental barrier coating 62.

Figure 5:
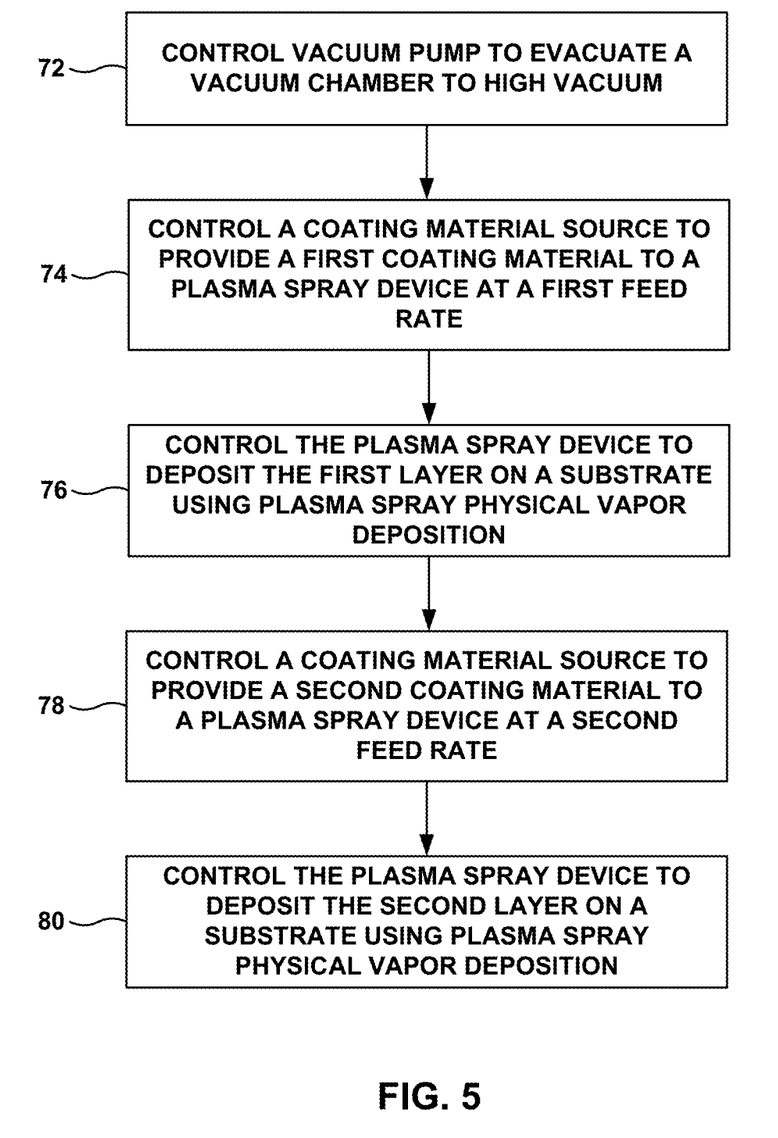
FIG. 5 is a flow diagram illustrating an example technique for forming a multilayer, multi-microstructure environmental barrier coating using plasma spray physical vapor deposition.

FIG. 5 is a flow diagram illustrating an example technique for forming a coating that includes a multilayer, multi-microstructure environmental barrier coating using PS PVD. The technique of FIG. 5 will be described with respect to system 10 of FIG. 1 and article 30 of FIG. 2 for ease of description only. A person having ordinary skill in the art will recognize and appreciate that the technique of FIG. 5 may be implemented using systems other than system 10 of FIG. 1, may be used to form articles other than article 30 of FIG. 2 (such as article 50 of FIG. 3 or article 60 of FIG. 4), or both.

The technique of FIG. 5 may include, controlling, by computing device 22, vacuum pump 24 to evacuate vacuum chamber 12 to a high vacuum (72). As described above, vacuum pump 24 may be used to evacuate vacuum chamber 12 to high vacuum, e.g., less than about 10 torr (about 1.33 kPa), or between about 0.5 torr (about 66.7 pascals) and about 10 torr (about 1.33 kPa). In some examples, computing device 22 may control vacuum pump 24 and a source of substantially inert gas (e.g., helium, argon, or the like) to evacuate vacuum chamber 12 in multiple pump-downs. For example, computing device 22 may control vacuum pump 24 to evacuate vacuum chamber 12 of the atmosphere present when substrate 16 is placed in vacuum chamber 12. Computing device 22 then may control the source of the substantially inert gas to fill vacuum chamber 12 with the substantially inert gas. Computing device 22 may control vacuum pump 24 to evacuate vacuum chamber 12 of the substantially inert gas (and remaining atmosphere). In some examples, computing device 22 may control the source of the substantially inert gas and vacuum pump 24 to fill and evacuate vacuum chamber 12 at least one time (e.g., a plurality of times) to substantially remove reactive gases from vacuum chamber 12 and leave substantially only inert gases such as helium, argon, or the like in vacuum chamber 12.

The technique of FIG. 5 also may include, controlling, by computing device 22, coating material source 26 to provide a first coating material to plasma spray device 20 at a first feed rate (74). As described above, the first coating material may include silica and at least one rare earth oxide. The amount of the at least one rare earth oxide and the amount of silica may be selected so that first layer 38 deposited from the first coating material includes a predetermined ratio of the at least one rare earth oxide and silica. In some examples, due to the differences in vapor pressure between rare earth oxides and silica, the ratio of the at least one rare earth oxide and silica in the first coating material provided by coating material source 26 may include additional silica compared to the composition of first layer 38, as described above.

The excess silica in the coating source may facilitate formation of first layer 38 including a rare earth disilicate. As described above, silica may have a higher vapor pressure than some rare earth oxides, at a given pressure and temperature. This may result in silica being more likely to be lost via volatilization during the processing, such that silica deposits in first layer 38 in a lower ratio than the ratio of silica to rare earth oxide in the first coating material. Thus, by including excess silica in a predetermined amount, first layer 38 may be formed with a desired amount of silica. For example, the excess amount of silica may be selected such that the ratio of silica to rare earth oxide deposited in first layer 38 is substantially the same as a stoichiometric ratio of the rare earth disilicate. In other examples, the amount of silica in the coating material may be selected to result in a predetermined amount of excess silica or excess rare earth oxide in first layer 38 compared to a stoichiometric ratio of rare earth oxide to silica in the rare earth disilicate. This may result in a selected amount of free silica or free rare earth oxide in first layer 38.

The first feed rate may be selected so PS PVD of the first coating material results in first layer 38 including a substantially dense microstructure. In some examples, a layer with a substantially dense microstructure may have a porosity of less than about 10 vol. %, such as, e.g., less than about 5 vol. %, where porosity is measured as a percentage of pore volume divided by total layer volume. Further, in some examples, a substantially dense microstructure is a microstructure in which pores are closed (not interconnected), such that substantially no gas path from the outer surface of first layer 38 to the inner surface of first layer 38 exists for gases or vapors to move through first layer 38.

For example, computing device 22 may control the feed rate to be relatively low, such that substantially all of the first coating material that coating material source 26 provides to plasma spray device 20 is vaporized. When first layer 38 is deposited from substantially fully vaporized first coating material, the resulting microstructure of first layer 38 may be substantially dense.

The technique of FIG. 5 also includes controlling, by computing device 22, plasma spray device 20 to deposit first layer 38 including a rare earth disilicate on substrate 16 (76). As described above, first layer 38 may include a rare earth disilicate formed by reaction of the silica and the at least one rare earth oxide. During the PS PVD technique, the first coating material may be introduced into plasma 28, e.g., internally or externally to plasma spray device 20. In PS PVD, vacuum chamber 12 is at a pressure lower than that used in low pressure plasma spray. For example, as described above, computing device 22 may control vacuum pump 24 to evacuate vacuum chamber 12 to a high vacuum with a pressure of less than about 10 torr (about 1.33 kPa). In contrast, in low pressure plasma spray, the pressure in a vacuum chamber is between about 50 torr (about 6.67 kPa) and about 200 torr (about 26.66 kPa). Because of the lower operating pressure, the plasma may be larger in both length and diameter, and may have a relatively uniform distribution of temperature and particle velocity.

The temperature of plasma 28 may, in some examples, be above about 6000 K, which may result in vaporization of substantially all (e.g., all or nearly all) of the coating material, depending upon the rate of introduction of the coating material to the plasma 28. Plasma 28 may carry the coating material toward substrate 16, where the coating material deposits in a layer on substrate 16. Because the coating material is carried by plasma 28 toward substrate 16, PS PVD may provide some non line-of-sight capability, depositing coating material on at least partially obstructed surfaces (surfaces that are not in direct line of sight with plasma spray device 20). This may facilitate forming first layer 38 on substrates with more complex geometry (e.g., non-planar geometry).

The technique of FIG. 5 additionally may include, controlling, by computing device 22, coating material source 26 to provide a second coating material to plasma spray device 20 at a second feed rate (78). As described above, the second coating material may include silica and at least one rare earth oxide, or may include a thermal barrier coating composition comprising a base oxide comprising zirconia or hafnia, a primary dopant comprising ytterbia, a first co-dopant comprising samaria, and a second co-dopant comprising at least one of lutetia, scandia, ceria, gadolinia, neodymia, or europia.

When the first coating material includes silica and the at least one rare earth oxide, the amount of the at least one rare earth oxide and the amount of silica may be selected so that second layer 40 deposited from the second coating material includes a predetermined ratio of the at least one rare earth oxide and silica. In some examples, due to the differences in vapor pressure between rare earth oxides and silica, the ratio of the at least one rare earth oxide and silica in the second coating material provided by coating material source 26 may include additional silica compared to the composition of second layer 40, as described above.

The excess silica in the second coating source may facilitate formation of second layer 40 including a rare earth monosilicate. By including excess silica in a predetermined amount, second layer 40 may be formed with a desired amount of silica. For example, the excess amount of silica may be selected such that the ratio of silica to rare earth oxide deposited in second layer 40 is substantially the same as a stoichiometric ratio of the rare earth monosilicate. In other examples, the amount of silica in the coating material may be selected to result in a predetermined amount of excess silica or excess rare earth oxide in second layer 38 compared to a stoichiometric ratio of rare earth oxide to silica in the rare earth monosilicate. This may result in a selected amount of free silica or free rare earth oxide in second layer 40.

The second feed rate may be selected so PS PVD of the second coating material results in second layer 40 including a columnar microstructure. For example, computing device 22 may control the feed rate to be relatively higher, such that not all of the second coating material that coating material source 26 provides to plasma spray device 20 is vaporized. When second layer 40 is deposited from not fully vaporized second coating material, the resulting microstructure of second layer 40 may be columnar. The technique of FIG. 5 also includes controlling, by computing device 22, plasma spray device 20 to deposit second layer 40 including a rare earth disilicate on first layer 38 (80).

In some examples, the second layer may include the rare earth monosilicate, and the technique of FIG. 5 may further, optionally, include controlling, by computing device 22, the coating material source 26 to provide a third coating material to plasma spray device 20 at a third feed rate. The third coating material may have a composition selected so that a third layer formed on the second layer from the third coating material includes the thermal barrier coating composition comprising the base oxide comprising zirconia or hafnia; the primary dopant comprising ytterbia; the first co-dopant comprising samaria; and the second co-dopant comprising at least one of lutetia, scandia, ceria, gadolinia, neodymia, or europia. In such examples, the technique of FIG. 5 may further include controlling, by computing device 22, plasma spray device 20 to deposit the third layer on the second layer using PS PVD.

In some examples, computing device 22 may control coating material source 26 and plasma spray device 20 to deposit alternating layers of the rare earth monosilicate and the thermal barrier composition, each layer having a columnar microstructure.

In some examples, during the PS-PVD technique, computing device 22 may control plasma spray device 20, stage 14, or both to move plasma spray device 20, substrate 16, or both relative to each other. For example, computing device 22 may be configured to control plasma spray device 20 to scan the plasma plume relative to substrate 16.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in a computer system-readable medium, such as a computer system-readable storage medium, containing instructions. Instructions embedded or encoded in a computer system-readable medium, including a computer system-readable storage medium, may cause one or more programmable processors, or other processors, to implement one or more of the techniques described herein, such as when instructions included or encoded in the computer system-readable medium are executed by the one or more processors. Computer system readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer system readable media. In some examples, an article of manufacture may comprise one or more computer system-readable storage media.

EXAMPLES

Example 1

Figure 6:
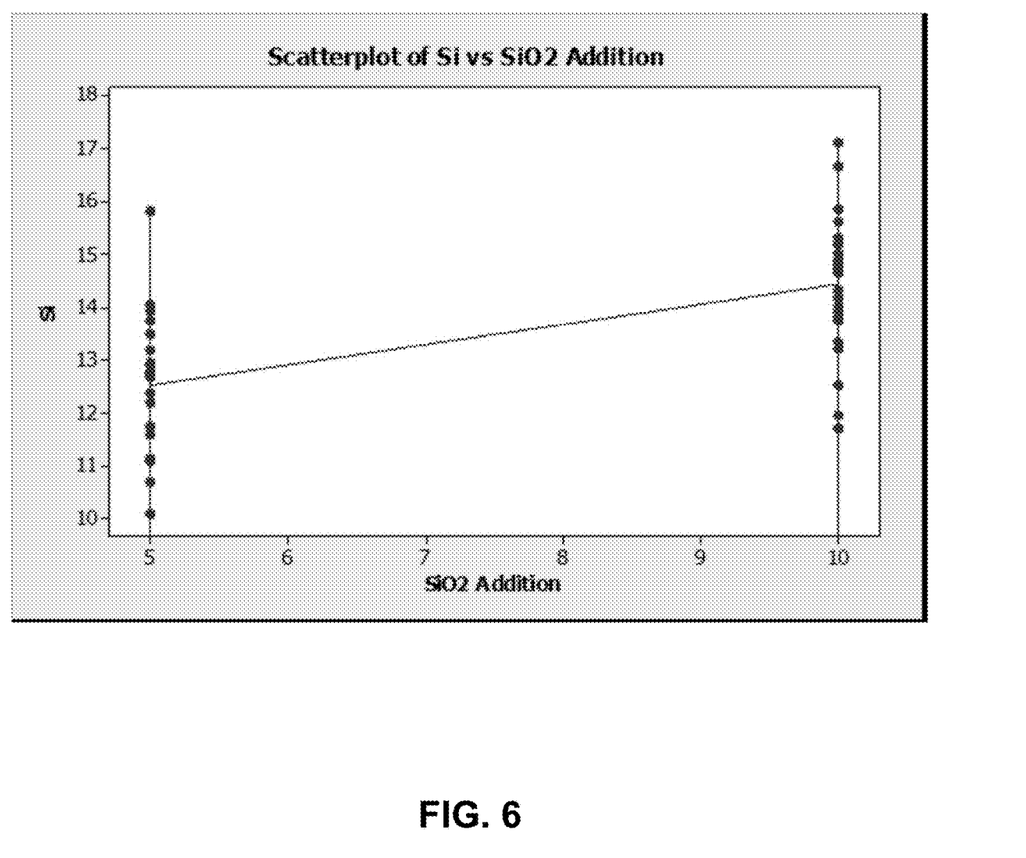
FIG. 6 is a scatter diagram illustrating an example relationship between excess silica in a coating material and an amount of silicon in a resulting coating.

FIG. 6 is a scatter diagram illustrating an example relationship between excess silica in a coating material and an amount of silicon in a resulting coating. The units on the x-axis of FIG. 6 are weight percent excess silica ($SiO_2$) in the coating material. Excess silica is defined with reference to a stoichiometric amount of silica in the coating material. In this example, the coating material includes a mixture of silica, ytterbium disilicate ($Yb_2Si_2O_7$), and alumina. For the samples with 5 wt. % excess silica, the mixture included 1 wt. % alumina and a balance ytterbium disilicate. For the samples with 5 wt. % excess silica, the mixture included 3 wt. % alumina and a balance ytterbium disilicate. The units on the y-axis of FIG. 6 are weight percent elemental silicon (Si) in the resulting coating, as measured by a microprobe. A stoichiometric ytterbium disilicate would include about 10.9 wt. % silicon. As shown in FIG. 6, increasing excess silica in the coating material generally increased the amount of silicon in the resulting coating.

Example 2

Figure 7:
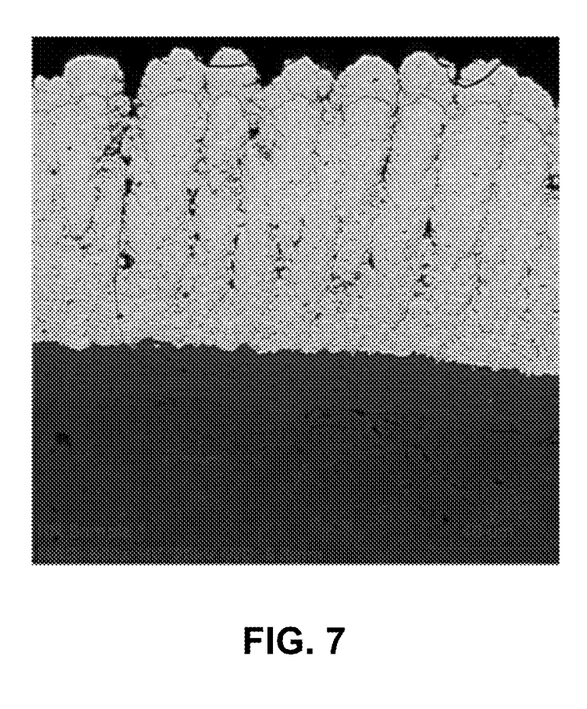
FIG. 7 is a cross-sectional picture of an example coating deposited using PS-PVD as described in this disclosure.

FIG. 7 is a cross-sectional picture of an example coating deposited using PS-PVD as described in this disclosure. The coating illustrated in FIG. 7 was deposited from a coating material including 5 wt. % excess silica, 1 wt. % alumina and a balance ytterbium disilicate. The PS-PVD parameters included using a He carrier gas with oxygen introduced into the PS-PVD chamber. The power was about 119.9 kW, and the coating time was about 12 minutes and 30 seconds. The coating was applied directly to the substrate with a line-of-sight relationship. As shown in FIG. 7, with these conditions, the coating included a columnar microstructure.

Example 3

Figure 8:
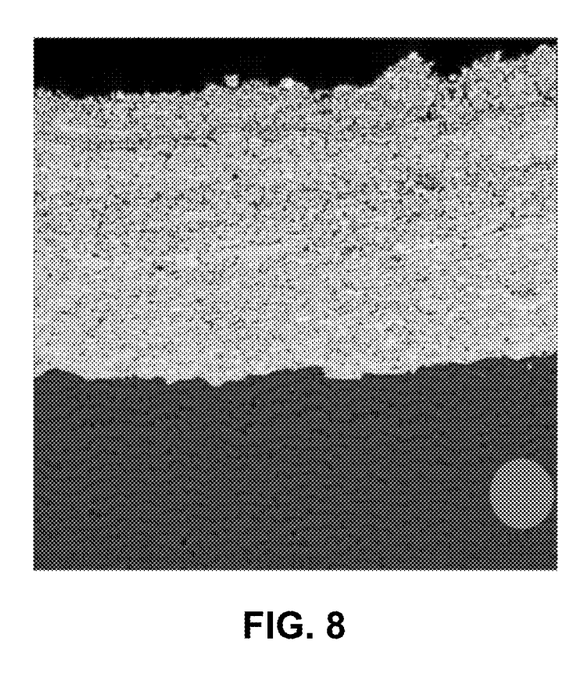
FIG. 8 is a cross-sectional picture of an example coating deposited using PS-PVD as described in this disclosure.

FIG. 8 is a cross-sectional picture of an example coating deposited using PS-PVD as described in this disclosure. The coating illustrated in FIG. 8 was deposited from a coating material including 5 wt. % excess silica, 3 wt. % alumina and a balance ytterbium disilicate. The PS-PVD parameters included using a carrier gas with oxygen introduced into the PS-PVD chamber. The power was about 116.6 kW, and the coating time was about 12 minutes. The coating was applied directly to the substrate with a line-of-sight relationship. As shown in FIG. 8, with these conditions, the coating included a porous microstructure, including closed pores that do not extend through the thickness of the coating.

Example 4

Figure 9:
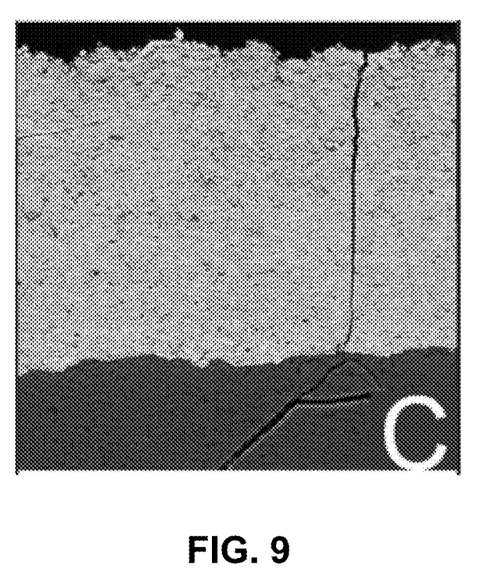
FIG. 9 is a cross-sectional picture of an example coating deposited using PS-PVD as described in this disclosure.

FIG. 9 is a cross-sectional picture of an example coating deposited using PS-PVD as described in this disclosure. The coating illustrated in FIG. 9 was deposited from a coating material including 5 wt. % excess silica, 3 wt. % alumina and a balance ytterbium disilicate. The PS-PVD parameters included using a He carrier gas with no oxygen introduced into the PS-PVD chamber. The power was about 117.0 kW, and the coating time was about 17 minutes and 30 seconds. The coating was applied directly to the substrate with a line-of-sight relationship. As shown in FIG. 9, with these conditions, the coating included a substantially dense microstructure.

Various examples have been described. These and other examples are within the scope of the following claims.

What is claimed is:

1. A method comprising:
controlling, by a computing device, a vacuum pump to evacuate a vacuum chamber to high vacuum;
controlling, by the computing device, a coating material source to provide a first coating material to a plasma spray device at a first feed rate, the first coating material having a composition selected so that a first layer from the first coating material comprises a rare earth disilicate, between about 0.1 wt. % and about 3 wt. % alumina, and a microstructure having less than about 10 vol. % porosity, and the first feed rate being selected to result in a substantially dense microstructure for the first layer;
controlling, by the computing device, the plasma spray device to deposit the first layer on a substrate in the vacuum chamber using plasma spray physical vapor deposition, wherein the first layer comprises the rare earth disilicate, between about 0.1 wt. % and about 3 wt. % alumina, and the microstructure having less than about 10 vol. % porosity;
controlling, by the computing device, the coating material source to provide a second coating material to the plasma spray device at a second feed rate, the second coating material having a composition selected so that a second layer formed on the first layer from the second coating material comprises a rare earth monosilicate or a thermal barrier coating composition comprising a base oxide comprising zirconia or hafnia; a primary dopant comprising ytterbia; a first co-dopant comprising samaria; and a second co-dopant comprising at least one of lutetia, scandia, ceria, gadolinia, neodymia, or europia; and
controlling, by the computing device, the plasma spray device to deposit the second layer on the first layer using plasma spray physical vapor deposition, wherein the second layer comprises the rare earth monosilicate or the thermal barrier coating composition comprising the base oxide comprising zirconia or hafnia; the primary dopant comprising ytterbia; the first co-dopant comprising samaria; and the second co-dopant comprising at least one of lutetia, scandia, ceria, gadolinia, neodymia, or europia.

2. The method of claim 1, wherein the first coating material comprises excess silica compared to the rare earth disilicate.

3. The method of claim 1, wherein at least one of the first coating material or the second coating material further comprises at least one of alumina, at least one alkali oxide, or at least one alkaline earth oxide.

4. The method of claim 1, wherein the first layer and the second layer are deposited on at least one surface of the substrate that is not in a line-of-sight relationship with the plasma spray device.

5. The method of claim 1, wherein:
the second layer comprises the thermal barrier coating composition comprising the base oxide comprising zirconia or hafnia; the primary dopant comprising ytterbia; the first co-dopant comprising samaria; and the second co-dopant comprising at least one of lutetia, scandia, ceria, gadolinia, neodymia, or europia; and
the second coating material comprises the base oxide comprising zirconia or hafnia; the primary dopant comprising ytterbia; the first co-dopant comprising samaria; and the second co-dopant comprising at least one of lutetia, scandia, ceria, gadolinia, neodymia, or europia.

6. The method of claim 1, wherein the second layer comprises the rare earth monosilicate, and wherein the second coating material comprises excess silica compared to the rare earth monosilicate.

7. The method of claim 1, further comprising:
controlling, by the computing device, the coating material source to provide a third coating material to the plasma spray device at a third feed rate, the third coating material having a composition selected so that a third layer formed on the second layer from the third coating material comprises the thermal barrier coating composition comprising the base oxide comprising zirconia or hafnia; the primary dopant comprising ytterbia; the first co-dopant comprising samaria; and the second co-dopant comprising at least one of lutetia, scandia, ceria, gadolinia, neodymia, or europia; and
controlling, by the computing device, the plasma spray device to deposit the third layer on the second layer using plasma spray physical vapor deposition, wherein the third layer comprises the thermal barrier coating composition comprising the base oxide comprising zirconia or hafnia; the primary dopant comprising ytterbia; the first co-dopant comprising samaria; and the second co-dopant comprising at least one of lutetia, scandia, ceria, gadolinia, neodymia, or europia.

8. The method of claim 7, wherein:
the second coating material has a composition selected so that the second layer from the second coating material comprises the rare earth monosilicate, between about 0.1 wt. % and about 3 wt. % alumina, and a columnar microstructure.

9. The method of claim 1, wherein the first coating material has a composition selected so that the first layer from the first coating material comprises the rare earth disilicate, between about 0.5 wt. % and about 3 wt. % alumina, and the microstructure having less than about 10 vol. % porosity.

10. The method of claim 1, wherein the second coating material has a composition selected so that the second layer from the second coating material comprises the rare earth monosilicate, between about 0.1 wt. % and about 3 wt. % alumina, and a columnar microstructure.

11. The method of claim 1, wherein the second coating material has a composition selected so that the second layer from the second coating material comprises the rare earth monosilicate, between about 0.5 wt. % and about 3 wt. % alumina, and a columnar microstructure.

12. The method of claim 1, wherein the first coating material has a composition selected so that the first layer consists of the rare earth disilicate and alumina, and the microstructure having less than about 10 vol. % porosity.

13. The method of claim 1, wherein the first coating material has a composition selected so that the first layer comprises the rare earth disilicate, between about 0.1 wt. % and about 3 wt. % alumina, and at least one alkali oxide or at least one alkaline earth oxide.

14. The method of claim 1, wherein the second feed rate is selected to result in a columnar microstructure.

* * * * *